US006980095B2

(12) United States Patent
Wright et al.

(10) Patent No.: US 6,980,095 B2
(45) Date of Patent: Dec. 27, 2005

(54) ILLUMINATED VEHICLE REMOTE ENTRY DEVICE

(75) Inventors: James B. Wright, Sterling Heights, MI (US); Leonard E. Pagano, Warren, MI (US)

(73) Assignee: Lear Corporation, Southfield, MI (US)

( * ) Notice: Subject to any disclaimer, the term of this patent is extended or adjusted under 35 U.S.C. 154(b) by 129 days.

(21) Appl. No.: 10/802,307

(22) Filed: Mar. 17, 2004

(65) Prior Publication Data

US 2005/0205402 A1 Sep. 22, 2005

(51) Int. Cl.$^7$ .......................... B60R 25/10; G09G 5/00; H04M 1/00; H05K 7/02

(52) U.S. Cl. ........................... 340/426.36; 340/426.15; 340/426.36; 345/36; 345/76; 345/168; 345/700; 345/711; 345/905; 400/479; 400/480; 400/490; 361/683; 361/687

(58) Field of Search ........... 340/426.36; 345/168–169, 345/36, 76–83; 400/479–490; 361/683, 687

(56) References Cited

U.S. PATENT DOCUMENTS

| | | | | |
|---|---|---|---|---|
| 4,786,767 | A | 11/1988 | Kuhlman | |
| 6,303,887 | B1 | 10/2001 | Ando | |
| 6,462,468 | B1 | 10/2002 | Jones et al. | |
| 6,574,098 | B2 * | 6/2003 | Netzel et al. | 361/683 |
| 6,639,578 | B1 | 10/2003 | Comiskey et al. | |
| 6,824,321 | B2 * | 11/2004 | Ward et al. | 400/479 |
| 2002/0170809 | A1 | 11/2002 | Snider | |
| 2002/0175899 | A1 * | 11/2002 | Yang | 345/169 |
| 2003/0041443 | A1 | 3/2003 | Stevenson et al. | |
| 2003/0043120 | A1 * | 3/2003 | Han | 345/168 |
| 2003/0197461 | A1 | 10/2003 | Fukuda et al. | |

* cited by examiner

*Primary Examiner*—Jeffery Hofsass
*Assistant Examiner*—Lam Pham
(74) *Attorney, Agent, or Firm*—MacMillan, Sobanski & Todd, LLC

(57) ABSTRACT

A remote keyless entry electroluminiescent (EL) device includes at least one depressible button segment for activating a vehicle function. The entry device includes an upper housing with at least one aperture in the upper housing. An EL film is integral to the upper housing for illuminating at least one display area. A printed circuit board is disposed under the upper housing. An electrical contact is provided for supplying a power source from the printed circuit board to the EL film for illumination. A lower housing is adjoined to the upper housing, the upper housing and the lower housing encasing the printed circuit board wherein the EL film is in-molded as part of the upper housing for forming a single component.

16 Claims, 2 Drawing Sheets

ILLUMINATED VEHICLE REMOTE ENTRY DEVICE

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

1. Field of the Invention

The present invention relates in general to an electroluminiescent (EL) lighting, and more specifically, to illuminating a keypad of a remote vehicle entry transmitter.

2. Description of the Related Art

Remote vehicle entry transmitters are used for performing a wireless operation on a vehicle such as locking and unlocking a door, unlatching a trunk latch, or activating or deactivating an alarm system equipped on the vehicle. These remote entry devices are commonly referred to a remote keyless entry (RKE) fob. The RKE fob is carried with the operator of a vehicle and can wirelessly perform these functions when within a predetermined reception range of the vehicle. The RKE fob is typically a small rectangular or oval plastic housing with a plurality of depressible buttons for activating each one of the wireless operations. The outer surface of the housing is typically black in color. Each button is also typically black with a graphical display printed each of the buttons. The graphical display is commonly white or red. While these graphical displays are easily visible the daylight, they are not so easily visible during night hours in less ambient light. During the nighttime in poorly lit or no light conditions, the operator carrying the RKE fob must either have to recall the location of the each button on the RKE fob or press each button by trial and error until the appropriate button is depressed activating the intended function.

To assist the operator in viewing the buttons of the RKE fob during poor lighting conditions, lighting schemes may be added to the RKE fob for illumination purposes, however the packaging of lighting elements in the RKE fob are limited due to size and packaging constraints. LEDs typically used for backlighting, such as in phones, are small in size, however, LEDs must be properly positioned to illuminate more than one button or incorporate light piping to tunnel the light to the plurality of buttons. An individual LED used to illuminate more than one button often produces uneven distribution of lighting on each button.

Electroluminescence (EL) lighting uses an EL film that is excited by a high voltage source to produce an even distribution of lighting throughout the film. Keypads made with EL film may be inserted through fascia button holes for illumination, however, this creates separate and distinct components within the RKE fob and may be subject to misalignments when assembled. Stack-up and dimensional tolerancing issues are potential manufacturing problems when a first component is inserted into a second component. For example, a separate keypad having a plurality of buttons inserted into a fascia having a plurality of apertures to receive the plurality of buttons may result in misalignments due to dimensional tolerances of the two separately molded components.

SUMMARY OF THE INVENTION

The present invention has the advantage of illuminating a display area of a RKE fob using EL lighting while minimizing the number of components required to illuminate the display area.

A remote keyless entry electroluminiescent (EL) device includes at least one depressible button segment for activating a vehicle function. The entry device includes an upper housing, with at least one aperture in the upper housing. An EL film is integral to the upper housing for illuminating at least one display area. A printed circuit board is disposed under the upper housing. An electrical contact is provided for supplying a power source from the printed circuit board to the EL film for illumination. A lower housing is adjoined to the upper housing, the upper housing and the lower housing encasing the printed circuit board wherein the EL film is in-molded as part of the upper housing for forming a single component.

DETAILED DESCRIPTION OF PREFERRED EMBODIMENTS

Figure 1:
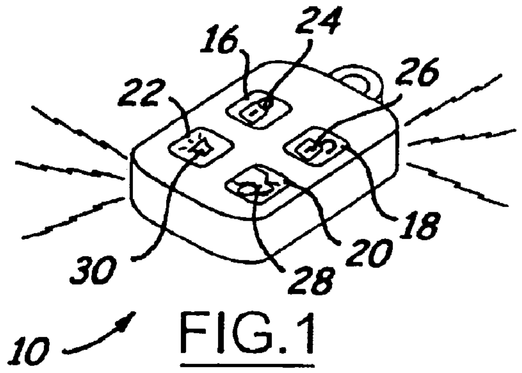
FIG. 1 is a perspective view of a RKE fob according to an embodiment of the present invention.

FIG. 1 shows a remote vehicle interface device such as a remote keyless entry (RKE) fob 10 that broadcasts RF signals for unlocking and locking a vehicle door, unlatching a trunk latch, and for activating and deactivating a vehicle alarm system. A vehicle lock switch 16 and a vehicle unlock switch 18 are commonly disposed on a face of the RKE fob 10. The RKE fob 10 may further include a trunk unlatch switch 20 and alarm switch 22 for activating and deactivating the vehicle alarm. Graphics are typically printed on the face of a respective switch identifying the functionality of each respective switch. For example, the lock switch 16 may have a locked padlock graphic design 24, and the unlock switch 18 may include an unlocked padlock graphic design 26. Likewise, the trunk unlatch switch 20 may have an open trunk graphic 28 and the alarm switch 22 may have a siren graphic 30. RKE fobs may include other buttons for vehicle functionality such as open/close sliding door, remote start, or panic alarm.

Figure 2:
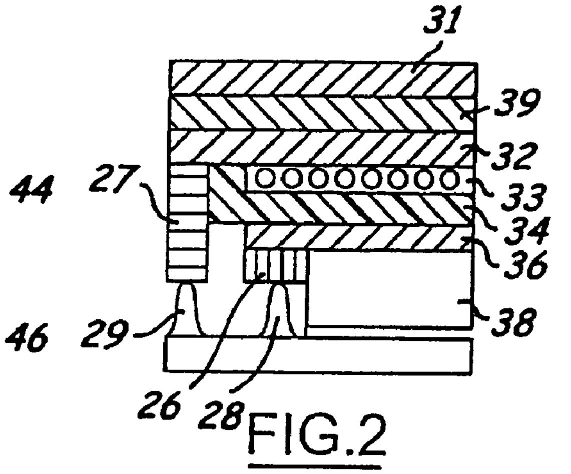
FIG. 2 is an exploded view of an EL film according to an embodiment of the present invention.

FIG. 2 illustrates an EL film composition used for illumination. The EL film 44 comprises a transparent electrode layer 32 formed over a layer of phosphor ink 33. The transparent electrode layer 32 may comprise ITO (indium tin oxide) material. A partially-opaque patterned layer 39 (e.g., silk screen) is deposited over the transparent electrode layer 32 to create a graphic design, if required. A transparent protective layer 31 is deposited over the top of an outermost layer (i.e., patterned layer 39 and transparent electrode layer 32) to prevent any underlying layers from scratches and wear, if a protective coating is desired. The phosphor layer 33 is the illumination source of the EL film 44. The phosphor layer 33 is deposited on a dielectric layer 34. The dielectric layer 34 is deposited on a rear conductor layer 36 (i.e., rear electrode) to create a dielectric barrier between the phosphor layer 33 and the rear conductor layer 36. The rear conducting layer 36 is deposited on a first silver contact pad 26. A second silver contact pad 27 extends vertically and is adjacent to ends of the lateral extending layers (i.e., an end of phosphor layer, rear conductor layer, and first silver layer) and is separated from the ends of the each layer by an air gap. The first silver contact pad 26 and the second silver contact pad 27 are in electrical contact with the rear conductor layer 36 and the transparent electrode layer 32, respectively. A first contact 28 and a second contact 29 are electrically attached to a printed circuit board 46. The first contact 28 and the second contact 29 are electrically connected to the first silver contact pad 26 and the second silver layer 27 for supplying power from the printed circuit board 46. The silver contact pads 26 and 27 are utilized as an interface between the electrode layers and the contacts since silver wears better and is more conductive than conductive ink, and silver does not react with metal contacts of a connector over time. As a result, each silver conductive pad contacts only a portion of each electrode layer to make an electrical connection between the electrodes and the contacts. In alternative embodiments, the contacts may be directly connected to the electrodes without the use of the silver contact pads. A portion of the dielectric layer 34 may extend beyond the phosphor layer 33 and fill in the air gap between the phosphor layer 33 and the second silver contact pad 27. A rear insulation layer 38 is disposed between a portion of the first silver contact pad 26 and the printed circuit board 46 for insulation purposes. In the preferred embodiment, the rear insulation layer 38 is the in-molded plastic from a casing of the RKE fob 10.

The phosphor layer 33 may comprise one or more colorized phosphor inks to enhance design of the graphics. In addition to using different colored phosphor inks to provide different colors, some spectrums of color may be changed (e.g., green to blue) by varying the frequency of the power supplied to the EL film 44. The patterned layer 39 is formed on the phosphor layer 33 to directly or indirectly create and illuminate the graphic design. For example, if the siren graphic 30 (shown in FIG. 1) is the actual element illuminated, then an area outlining the siren graphic will be opaquely coated on layer 39 such that only the actual siren graphic 30 is seen. Utilizing more than one phosphor ink allows the graphic design to be displayed in one or more colors. Alternatively, if the siren graphic is displayed by illuminating only the background, then the siren graphic 30 is opaquely coated in layer 39 and only the outlining area is seen. Furthermore, the background area and the graphic design may be illuminated simultaneously using different color phosphor inks.

Various conductive materials such as silver ink may be used as the conductive element for the rear electrode 36, however, if environmental durability of a greater magnitude is required, a layer of carbon ink may be disposed between a layer of silver ink and the dielectric layer 34. The phosphor layer 33 luminesces when subjected to an electric field of alternating current. For portable devices such as the RKE fob 10, a direct current (DC) source of 3–5 volts is provided and a driving circuit with an inverter is used to convert the DC power source to a high AC voltage. The higher the AC voltage, the brighter the EL film 44 will illuminate. Utilizing higher voltages to illuminate the EL film 44 may lead to a shorter useful life of the EL film 44. Consequently, by duty cycling the voltage, the useful life of the EL film 44 may greatly be extended.

Unlike conventional lamps, the EL film 44 will not burn out since there is no gas or lighting filament within the film. Furthermore, the EL film 44 is shock resistant and will not break if dropped. An advantage of the EL illumination is its ability to illuminate over a wide area (i.e., defined by the length and width of the EL film) without generating heat. The EL film 44 is essentially a cool lighting element with no heat build up or heat dissipation.

Figure 3:
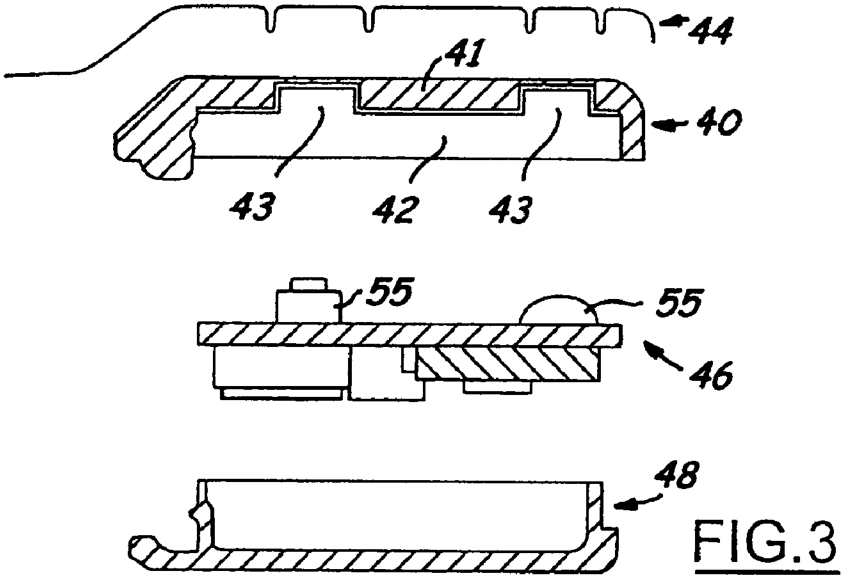
FIG. 3 is an exploded cross-sectional view of the RKE fob according to an embodiment of the present invention.

FIG. 3 illustrates an exploded view of the RKE fob 10 incorporating the EL film 44. An upper housing 40 is made of a plastic composite and includes a top exterior surface 41 and an open interior surface 42. The upper housing 40 forms half of a shell for encasing internal components. The top exterior surface includes one or more apertures 43 for access to tact switches on a printed circuit board 46. The layer of EL film 44 (shown separately here for illustration purposes only) is in-molded as part of the upper housing 40 so as to form one molded unit. A molding process such as injection molding may be used to form the two units into a single component. The printed circuit board 46 is disposed within the interior open space 42 of the upper housing 40. The printed circuit board 46 includes the electronic components and circuitry for the various functions of the RKE fob 10. The printed circuit board 46 further includes the power supply, driving circuit, tact switches 55, and an electrical contact to provide power to the EL film 44. A lower housing 48 is fixed to the upper housing 40 for encasing the printed circuit board 46.

Figure 4A:
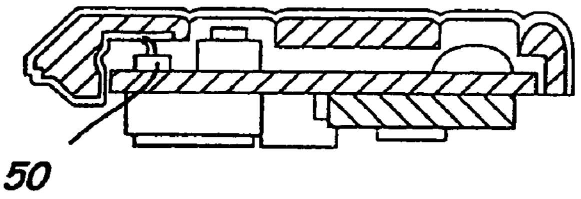
FIG. 4*a* is a side cut-away view of the RKE fob incorporating an electrical contact to the EL film according to a first preferred embodiment of the present invention.
Figure 4B:
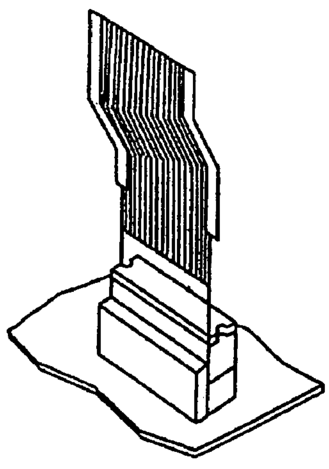
FIG. 4*b* is an enlarged view of the electrical contact according to the preferred embodiment of the present invention.

Various connectors may be used to provide power to the EL film 44 from the power supply of the printed circuit board 46. In the preferred embodiment, as shown in FIG. 4*a,* the electrical contact used to provide power to the EL film 44 comprises a zero insertion force (ZIF) connector 50. The EL film 44 is slideable within the ZIF connector 50. After the portion of the EL film 44 is inserted within the ZIF connector 50, a locking feature on the ZIF connector 50 is actuated to secure the portion of the EL film 44 within the ZIF connector 50. FIG. 4*b* illustrates a perspective view of a typical ZIF connector.

The present invention requires electrical contact on the transparent electrode 32 and an electrical contact on the rear electrode layer 36. A typical ZIF connector can accommodate 2 to 24 different circuits. The ZIF connector 50, in the preferred embodiment, is electrically attached and secured to the printed circuit board 46. To utilize the ZIF connector 50 in combination with the EL film 44, a portion of the EL film 44 must extend beyond the upper housing 40 during the molding process. The portion of the EL film 44 extending beyond the upper housing 40 requires no additional component to mate with the ZIF connector 50. The EL film 44 is sized to a predetermined width as shown in FIG. 4*a*. To make an electrical connection to appropriate layer (i.e., the transparent electrode layer or rear electrode layer), outer layers of the EL film 44 are selectively removed to expose the desired electrode for electrical attachment within the ZIF connector 50. For example, if circuit 2 of the ZIF connector 50 is electrically attached to the transparent electrode layer 32, layers are selectively removed until the transparent electrode layer 32 is exposed to the electrical contacts of circuit 2 of the ZIF connector 50. A next designated circuit would be used to electrically attach to the rear electrode layer 36 wherein layers are selectively removed to expose the rear electrode layer 36 to the electrical contacts at the designated circuit of the ZIF connector 50.

If separate regions or buttons are to be illuminated at different times, then the transparent layer 32 would be separated into separate circuits with each circuit disposed over a respective region of the phosphor layer requiring illumination. Each respective circuit would have a respective electrical contact within the ZIF connector 50 for providing an alternating electric field to the respective circuit for illuminating the respective region or button.

Figure 5:
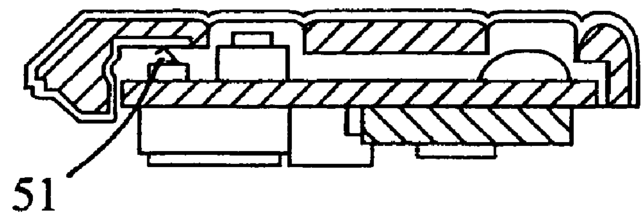
FIG. 5 is a side cut-away view of the RKE fob incorporating an electrical contact to the EL film according to a second preferred embodiment of the present invention.
Figure 6:
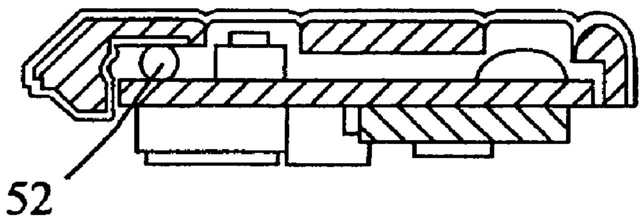
FIG. 6 is a side cut-away view of the RKE fob incorporating an electrical contact to the EL film according to a third preferred embodiment of the present invention.

FIG. 5 shows a second preferred embodiment for electrically connecting the EL film 44 to the printed circuit board 46. A spring contact 51 is electrically attached to the printed circuit board 46. The portion of EL film 44 extending beyond the upper housing 40 is adhered to an underside surface of the upper housing 40. Preferably, the portion of the EL film 44 is permanently fixed onto the underside surface of the upper housing 40 during the molding process so that the portion of the EL film 44 is exposed to the interior open space 42. As the printed circuit board 46 is inserted into the open interior space 42, the spring contact 51 is compressed against the exposed portion of the EL film 44 thereby creating an electrical connection between the printed circuit board 46 and the EL film 44. Two spring contacts would be required to make individual electrical connections to the transparent electrode layer 32 and the rear electrode layer 36. Various layers would be removed to provide the electrical connection to the respective layer as described earlier. Alternatively, as shown in FIG. 6, a conductive epoxy 52 (or conductive rubber) may be used in place of the spring contact 51. The conductive epoxy 52 is adhered on a surface of the printed circuit board 46 to a predetermined height and is compressed against a layer of the EL film 44 when the printed circuit board 46 is inserted into the open interior housing 42. Likewise two individual conductive epoxy contacts would be required to make the electrical contact to the respective layer.

Figure 7:
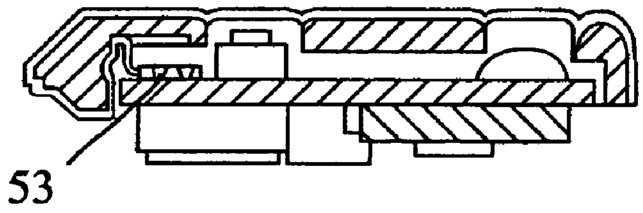
FIG. 7 is a side cut-away view of the RKE fob incorporating an electrical contact to the EL film according to a fourth preferred embodiment of the present invention.

FIG. 7 illustrates yet another embodiment for electrically attaching the EL film 44 to the printed circuit board 46. A crimp-style connector 53 is electrically connected to the printed circuit board 46. The portion of the EL film 44 (as described earlier) is inserted in the crimp-style connector 53. Legs of the crimp-style connector 53 are folded over to electrically secure the portion of the EL film 44. Two crimp-style connectors would be required to electrically connect to each respective layer.

Figure 8:
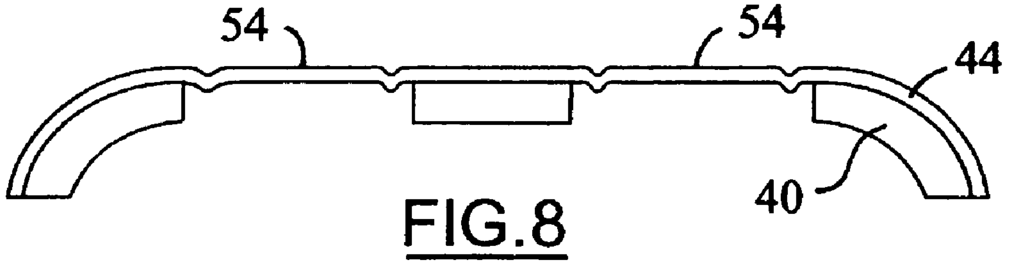
FIG. 8 is a side cut-away view of an upper housing integrating the EL film according to a first preferred embodiment of the present invention.

FIG. 8 illustrates the integration of the upper housing 40 and the EL film 44 after the in-mold process. The EL film 44 is in-molded on the top exterior surface 41 of the upper housing 40. The EL film 44 creates a continuous sealed surface area over the entire surface of the upper housing 44. Gaps and crevices typically formed from a plurality of inserted stackable components (e.g. buttons and button apertures) are thereby eliminated which otherwise leaves a potential nesting area for dirt and debris. Stack-up and dimensional tolerancing issues and misalignments created by assembly of a first component into a second component (e.g., a separate EL film pad having multiple buttons being inserted into a separate casing having multiple apertures) are thereby eliminated with the integration of the EL film 44 molded into the upper housing 40. Furthermore, the continuous sealed surface area provides for an aesthetically pleasing appearance.

Button segments 54 formed in the upper casing 40 align with tact switches 55 (shown in FIG. 2) disposed on the printed circuit board 46. Each button segment is representative of one of the plurality of switches described earlier. A person using the RKE fob 10 depresses one of the button segments 54 for activating one of the vehicle functions. The depressed button segment contacts a respective tact switch on the printed circuit board 46 and a wireless signal is then generated for activating a vehicle function. Positioning each respective button segment at a predetermined distance from a respective tact switch allows the respective button segment to travel the predetermined distance before contacting the respective tact switch which provides the person activating the RKE fob 10 a tactile feel indicative of a button that has been positively depressed and actuated. Pills (not shown) formed as in-mold inserts may be added to the underside of the EL film 44 of the button segments 54 for shortening the distance of travel if required.

Figure 9:
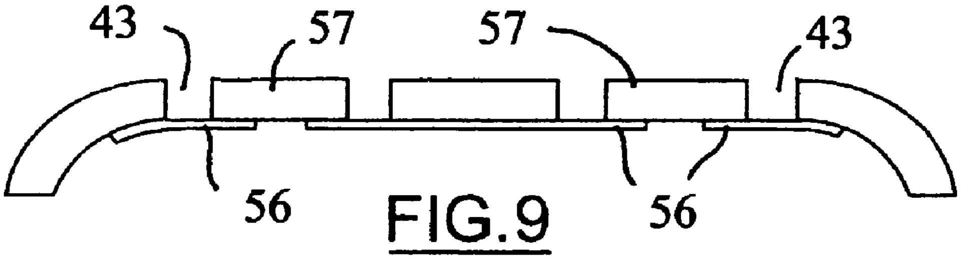
FIG. 9 is a side cut-away view of the upper housing integrating the EL film according to a second preferred embodiment of the present invention.

FIG. 9 illustrates the integration of the upper housing 40 and the EL film 44 after the in-mold process according to another embodiment. This embodiment illustrates a non-continuous surface area including an illuminated region surrounding a plurality of apertures 43. A plurality of buttons 57 is disposed within the plurality of apertures 43 of the upper housing 40. A rubberized pad 56 maintains an underside surface area of each button to the surrounding underside surface area of the upper casing 40. The rubberized pad 56 is pliable to allow each button to individually contact a respective tact switch when depressed. The EL film 44 is disposed only on the non-moveable surfaces of the exterior surfaces of the upper housing 40. As a result, any surrounding surface area around each respective button may be illuminated. Alternatively, if the continuous sealed surface area design, as shown in FIG. 7, is utilized, non-illuminating surface layers may be disposed on each button to achieve the same visual effect as shown in FIG. 8 but with the addition of the continuous sealed surfacing.

From the foregoing description, one ordinarily skilled in the art can easily ascertain the essential characteristics of this invention and, without departing from the spirit and scope thereof, can make various changes and modifications to the invention to adapt it to various usages and conditions. For example, any graphic design (names, logos, flags, etc.) may be implemented anywhere on the RKE fob other than the buttons.

What is claimed:

1. A remote keyless entry electroluminiescent (EL) device including at least one depressible button segment for activating a vehicle function, said entry device comprising:

an upper housing, said upper housing including at least one aperture;

an EL film integral to said upper housing for illuminating at least one display area;

a printed circuit board disposed under said upper housing;

an electrical contact for supplying a power source from said printed circuit board to said EL film for illumination; and a lower housing joined to said upper housing, to encase said printed circuit board;

wherein said EL film is in-molded as part of a top exterior surface of said upper housing for forming a single component.

2. The EL device of claim 1 wherein said EL film is injection molded onto said upper housing.

3. The EL device of claim 1 wherein said EL film is in-molded to said upper housing to form a continuous surface area.

4. The EL device of claim 3 wherein said at least one depressible button segment is formed over said at least one aperture.

5. The EL device of claim 4 wherein said display area is disposed on said at least one button segment.

6. The EL device of claim 1 wherein said display area comprises a graphical display.

7. The EL device of claim 6 wherein said graphical display is illuminated by at least one phosphor ink.

8. The EL device of claim 1 further comprising a graphic display, wherein said display area comprises an area outlining said graphical display.

9. The EL device of claim 1 further comprising a graphical display, wherein said display area comprises said graphical display and an area outside of said graphical display.

10. The EL device of claim 1 wherein said at least one button segment comprises a depressible button, said depressible button extends through said aperture, said upper casing and said depressible button are attached by a connecting element.

11. The EL device of claim 10 wherein said connecting element comprises a rubberized pad.

12. The EL device of claim 11 wherein said EL film is disposed on a region around said depressible button, said region provides illumination for background lighting to said depressible button.

13. The EL device of claim 1 wherein said electrical contact comprises a zero insertion force connector.

14. The EL device of claim 1 wherein said electrical contact comprises a spring contact.

15. The EL device of claim 1 wherein said electrical contact includes a crimp style connector.

16. The EL device of claim 1 wherein said electrical contact includes a conductive epoxy, said conductive epoxy compressible between said printed circuit board and said EL film.

* * * * *